United States Patent
Kim

(12) 
(10) Patent No.: US 6,404,020 B1
(45) Date of Patent: Jun. 11, 2002

(54) METHOD OF FORMING CONTACT PADS IN A SEMICONDUCTOR DEVICE AND A SEMICONDUCTOR DEVICE FORMED USING THE METHOD

(75) Inventor: Byeung-chul Kim, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/361,681

(22) Filed: Jul. 27, 1999

(30) Foreign Application Priority Data

Jul. 31, 1998 (KR) .............................. 98-31288

(51) Int. Cl.$^7$ .............................. H01L 29/72

(52) U.S. Cl. ................ 257/374; 257/510; 257/513; 257/515; 257/520

(58) Field of Search ................ 257/374, 510, 257/513, 520, 515

(56) References Cited

U.S. PATENT DOCUMENTS 5,892,264 A * 4/1999 Davis et al. ................ 257/520

\* cited by examiner

*Primary Examiner*—Edward Wojciechowicz
(74) *Attorney, Agent, or Firm*—Skjerven Morrill MacPherson LLP; David W. Heid

(57) ABSTRACT

A semiconductor device having a self-aligned contact pad and the method for manufacturing the device are disclosed. The semiconductor device includes: an isolation region formed in a semiconductor substrate; multiple conductive structures formed on the top surface of the semiconductor substrate; self-aligned conductive pads filling spaces between adjacent conductive structures and between the isolation region and the conductive structures. The method includes: forming a conductive structure on a semiconductor substrate; forming insulating sidewall spacers on the conductive structures, forming a conductive layer that fills spaces between the conductive structures and contacts the semiconductor substrate; and patterning the conductive layer.

13 Claims, 5 Drawing Sheets

METHOD OF FORMING CONTACT PADS IN A SEMICONDUCTOR DEVICE AND A SEMICONDUCTOR DEVICE FORMED USING THE METHOD

FIELD OF THE INVENTION

The present invention relates to a method of manufacturing an integrated circuit device, and more particularly to a method of forming contact pads without photo-mask and etching processes.

BACKGROUND OF THE INVENTION

To achieve greater integration in integrated circuits, design rules for semiconductor devices have reduced the dimensions of the elements of the devices to a degree that alignment of structures such as a contact plug with an underlying interconnect layer is critical. Accordingly, sub-quarter micron semiconductor devices such as Gbit DRAMs need manufacturing technology that self-aligns structures.

FIGS. 1A to 1F illustrate a conventional method for forming contact pads in a semiconductor device. Referring to FIG. 1A, a pad oxide layer 12 and a pad nitride layer 14 are sequentially formed on a semiconductor substrate 10. Pad nitride layer 14 and pad oxide layer 12 are etched using a mask (not shown) to expose a portion of substrate 10, and the exposed portion of substrate 10 is further etched using pad nitride layer 14 and pad oxide layer 12 as an etching mask for formation of a trench 16.

Referring to FIG. 1B, a thermal oxide layer 17 is grown in trench 16. A trench liner nitride layer 18 is formed on thermal oxide layer 17, and deposition of an insulating layer 20 fills trench 16. Then, a planarization process such as CMP (chemical mechanical polishing) removes upper portions of insulating layer 20 until pad nitride layer 14 is exposed, leaving trench isolation 21. After the completion of trench isolation 21, pad nitride layer 14 and pad oxide layer 12 are removed.

Referring to FIG. 1C, a gate oxide layer 22, a polycide layer 24, and a nitride layer 26 are sequentially deposited on the structure of FIG. 1B. Then, photo-masking and etching selectively etch nitride layer 26, polycide 24 and gate oxide layer 22 to form patterned gate electrode layers 27. Gate sidewall spacers 28 can be formed on the sidewalls of gate electrode layers 27, and impurity ions are implanted into substrate 10 to form source/drain regions 30 adjacent to gate electrode layers 27 in substrate 10.

Referring to FIGS. 1D to 1F, after the formation of source/drain regions 30, an oxide layer 32 is deposited on the structure of FIG. 1C and planarized as shown in FIG. 1D. Oxide layer 32 is selectively etched using conventional photo-masking and etching to form contact openings 34 which expose source/drain regions 30 of substrate 10. A conductive material layer 40 is then deposited on oxide layer 32 so as to fill contact openings 34. Patterning layer 40 forms contact pads 36a and 36b. In an exemplary semiconductor device such as a DRAM, contact pad 36a electrically connects to an overlying structure such as a bit line (not shown), and contact pad 36b, which is between gate electrode layer 27 and trench isolation 21, electrically connects to and overlying structures such as a storage node (not shown).

In the manufacturing processes described, if the mask for the etching of oxide layer 32 is misaligned relative to patterned gate electrode layer 27, etching can remove portions of silicon nitride layer 26 and thereby expose portions of polycide layer 24. This leads to a short between gate electrode (polycide layer 24) and contact pads 36a and 36b that are formed of conductive material layer 40.

SUMMARY OF THE INVENTION

A method in accordance with an embodiment of the invention forms self-aligned contact pads in an integrated circuit device such as a DRAM and avoids shorts between contact pads and conductive structures such as gate electrodes. The self-aligned process avoids electrical shorts that can result from misalignment in conventional contact formation processes.

A method in accordance with an embodiment of the present invention forms contact pads without forming a planar insulating layer and without subsequent photo-masking and etching of the planar insulating layer. The method forms spaced apart gate electrode structures on an integrated circuit device. The gate electrodes can be insulated using sidewall spacers on sidewalls of the gate electrode structures. A process such as vapour deposition fills spaces between gate electrode structures and between a gate electrode structure and a device isolation region with conductive material for contact pads. Etching the deposited conductive material forms contact pads in the spaces between the gate electrode structures.

Gate electrode structures can be made of stacked layers including, for example, a polysilicon layer, a metal silicide layer, and a nitride capping layer. The polysilicon may be from the mask used for forming the device isolation, i.e., trench isolation.

In one specific embodiment, an oxide layer and a first doped polysilicon layer are formed on a substrate. Photo-masking and etching processes remove portions of the first doped polysilicon, the oxide layer and the substrate to form a trench. An insulating trench fill layer such as an $O_3$-TEOS layer is deposited in the trench and on the doped polysilicon layer. The trench fill layer is then planarized down to the first polysilicon layer, thereby forming trench isolation which electrically isolates active regions of the substrate. Filling the trench with the insulating trench fill layer may be preceded by formation of thermal oxide in the trench and forming a silicon nitride layer thereon. The thermal oxide layer relieves substrate damage from previous etching of the substrate. The silicon nitride in the trench relieves stress applied to the trench walls.

A conductive layer such as metal silicide or second doped polysilicon is deposited on the first doped polysilicon and the trench isolation. A silicon nitride layer is then deposited on the conductive layer. Using photolithography, selected portions of the layers already formed on the substrate are etched to form spaced apart gate electrode structures and trench isolation that extends above the surface of the substrate.

In one embodiment, each gate electrode structure includes an oxide layer, a first doped polysilicon, a metal silicide layer, and a nitride layer. The oxide layer insulates gate electrode structures from the substrate. Sidewall insulation is formed on the gate electrode structures which still leaves portions of the substrate exposed between the gate electrodes.

Spaces between adjacent gate electrode structures and between gate electrode structure and trench isolation are filled with conductive material such as a third doped polysilicon layer. The third doped polysilicon is then etched to form contact pads in spaces between adjacent gate electrode structures and in spaces between the trench isolation and gate electrode structures. Patterning the third polysilicon layer also electrically isolates the contact pads from each other.

BRIEF DESCRIPTION OF THE DRAWINGS

The features and advantages of the invention are further described with reference to the accompanying drawings, in which.

Use of the same reference symbols in different figures indicates similar or identical items.

DETAILED DESCRIPTION

Figure 1A:
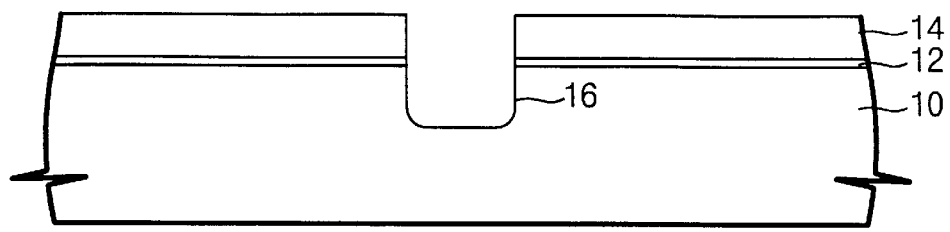
FIGS. 1A to 1F are cross-sectional views of integrated circuit structures illustrating a conventional method for forming contact pads.
Figure 1B:
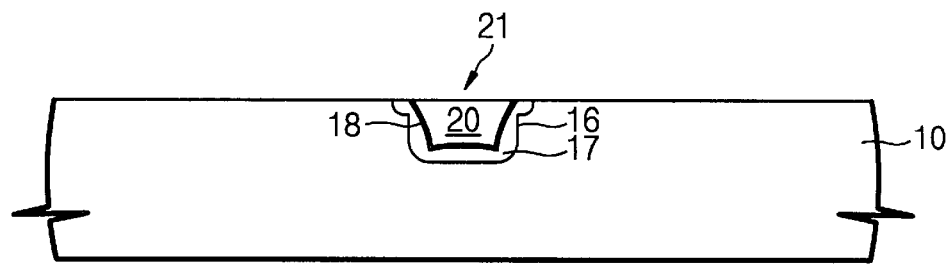
Figure 1C:
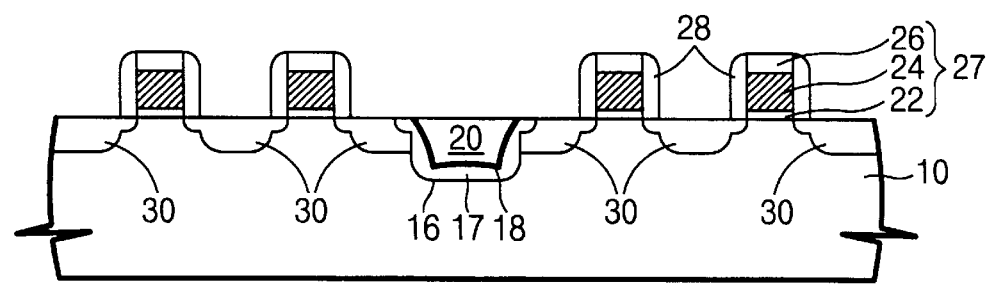
Figure 1D:
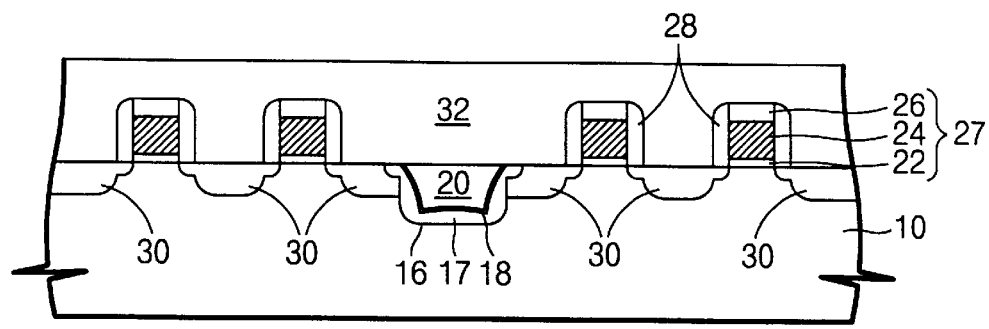
Figure 1E:
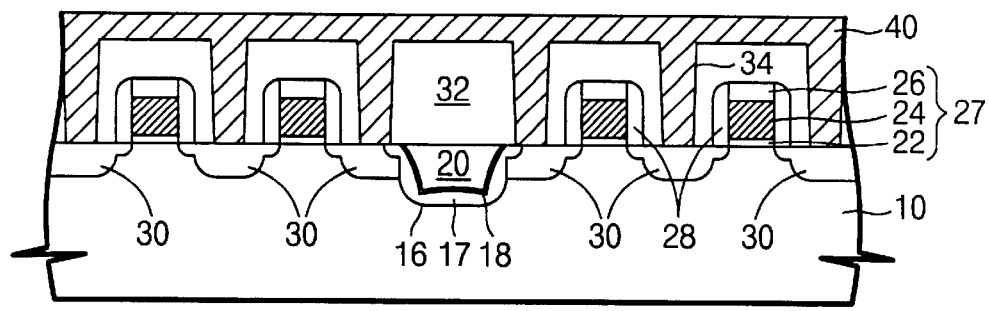
Figure 1F:
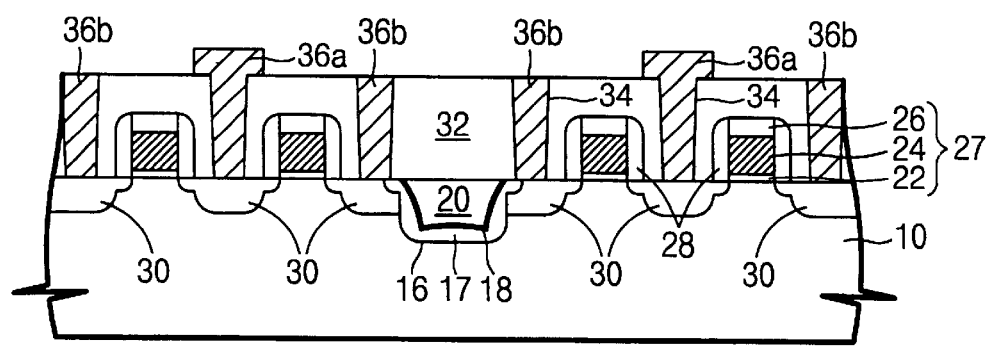

Embodiments of the present invention are described more fully hereinafter with reference to the accompanying drawings. The invention may, however, be embodied in different forms and should not be construed as limited to the embodiments set forth herein. Further, in the drawings, the thickness of layers and regions may be exaggerated for clarity. It will also be understood that when a layer or structure is referred to as being on another layer or substrate, the layer or structure can be directly on the other layer or substrate or intervening layers may be present. In contrast, when an element is referred to as being directly on another element, no intervening elements are present. Moreover, although specific conductivity types are described for particular dopants or impurities used in the described embodiment, each embodiment described and illustrated herein may instead employ dopants or impurities of complementary conductivity types.

Figure 2A:
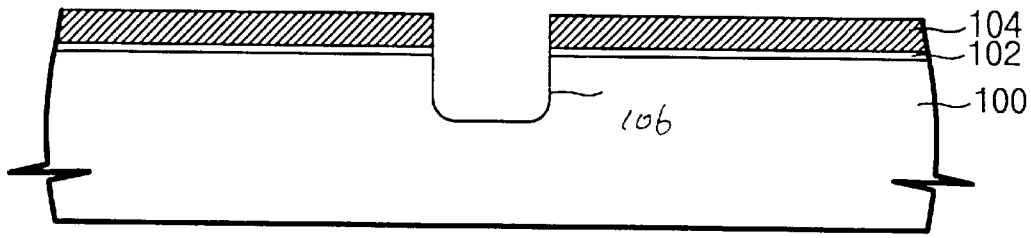
FIGS. 2A to 2G are cross-sectional views of integrated circuit structures illustrating a method for forming contact pads in accordance with an embodiment of the present invention.
Figure 2B:
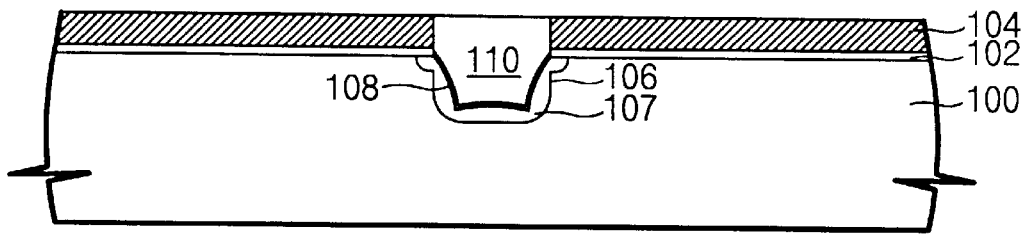

FIGS. 2A and 2B illustrate the formation of a device isolation region for a device in accordance with an embodiment of the invention. Referring to FIG. 2A, an oxide layer 102 having a thickness of about 50 to 150 Å and a first conductive layer 104 having a thickness of about 1,000 to 3,000 Å are sequentially formed on a semiconductor substrate 100. In one embodiment of the invention, first conductive layer 104 is made of doped polysilicon. Then, a photoresist layer (not shown) is formed (e.g., spin coated) on first conductive layer 104 and then patterned (e.g., exposed to a light pattern by photolithography and developed) into a configuration that defines active (covered) regions and isolation (exposed) regions of substrate 100. A known etching process, using the photoresist pattern layer as an etching mask, etches first conductive layer 104, oxide layer 102 and substrate 100 to form a trench 106 for the isolation region. After removal of the photo-resist mask, the remaining portions of oxide layer 102 and first conductive layer 104 are respectively used as a gate oxide layer and a gate electrode layer.

Referring to FIG. 2B, a thermal oxide layer 107 having a thickness of about 100 to 300 Å is formed on the inner surface of trench 106, i.e., on the bottom and sidewalls of trench 106 to relieve stresses created during the prior etching. Thermal oxide layer 107 also serves to offset stress later applied to trench 106. Subsequently, a trench liner nitride layer 108 is formed on thermal oxide layer 107. Trench liner nitride layer 108 serves to prevent oxidation of trench 106 by preventing oxygen from diffusing into substrate 100 during a subsequent oxidation process.

After the formation of trench liner nitride layer 108, a 2,000 to 10,000 Å thick insulating layer such as an $O_3$-TEOS oxide layer, a PSG (phosphosilicate glass) layer, a BPSG (borophosphosilicate glass) layer, a PE-TEOS (plasma enhanced tetraethylorthosilicate glass) layer, a BP-TEOS (borophosphotetraethylorthosilicate glass) layer or a USG (undoped silicate glass) layer is formed on first conductive layer 104 so as to fill trench 106. The insulating layer is planarized until a top surface of first conductive layer 104 is exposed. As a result, trench isolation 110 is formed. CMP (chemical mechanical polishing) can perform the planarization.

Formation of gate electrode structures is after formation of trench isolation 110. As described above, oxide layer 102 and first conductive layer 104, which were in the mask for forming trench isolation 110, respectively constitute a gate oxide layer and a gate electrode layer of the gate electrode structure.

Figure 2C:
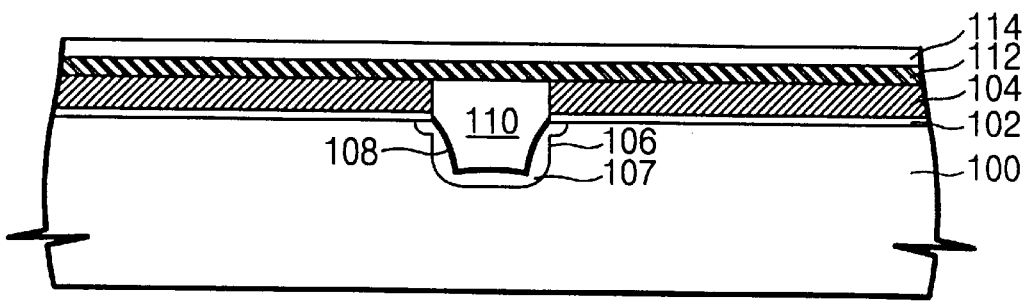

Referring to FIG. 2C, a second conductive layer 112 and a silicon nitride layer 114 are sequentially formed on first conductive layer 104. Typically, second conductive layer 112 is a doped polysilicon layer or a metal silicide layer such as a tungsten silicide layer. The thicknesses of second conductive layer 112 and silicon nitride layer 114 are respectively 1,000 to 3,000 Å and 500 to 1,000 Å.

Figure 2D:
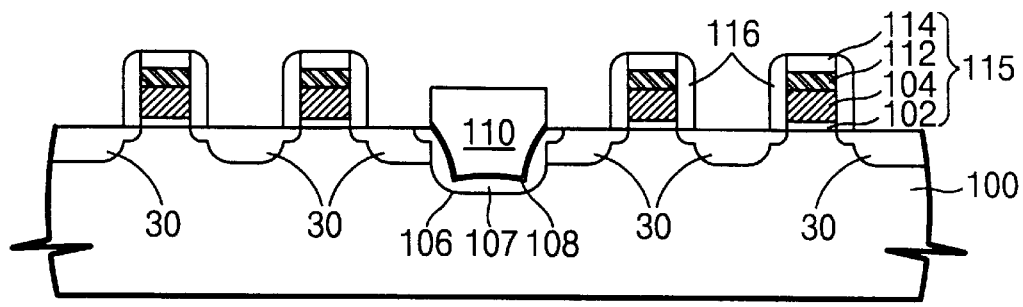

Referring to FIG. 2D, a conventional etching process, using a gate forming mask, selectively etches silicon nitride layer 114, second conductive layer 112, first conductive layer 104, and oxide layer 102 to form gate electrode structures 115 which are spaced apart from each other. This etching leaves isolation 110 with a top surface extending above the top surface of substrate 100 and leaves space between isolation 110 and gate electrode structures 115. After formation of gate electrode structures 115, a silicon nitride layer is deposited and anisotropically etched to form sidewall spacers 116 on sidewalls of gate electrode structures 115. Then, a known ion implantation process implants impurity ions into substrate 100 to form source/drain regions 30 which are in substrate 100 between gate electrode structures 115 and between trench isolation 110 and gate electrode structures 115. The implantation process can be varied according to the type of source/drain regions 30, such as LDD (light doped drain), DDD (double doped drain). ELDD, $LD^3$, MLDD, PLDD (profiled lightly doped drain), MLD, GOLD (gate-drain overlapped device), ITLDD (inverted-T LDD) and LATID (large tilt angle implanted drain). For example, a first implantation step can form lightly doped regions before formation of sidewall spacers 116, and a second implantation step can form more heavily doped source/drain regions after formation of sidewall spacers 116. Other well known processes can form other the types of source/drain regions.

Figure 2E:
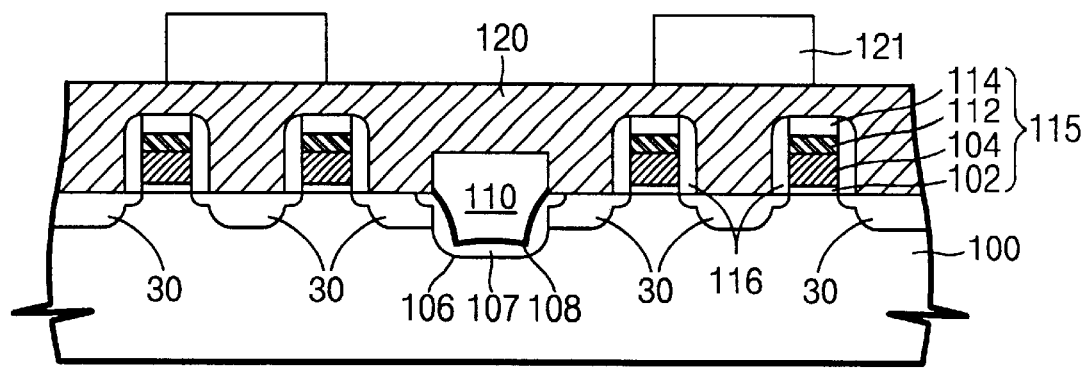
Figure 2F:
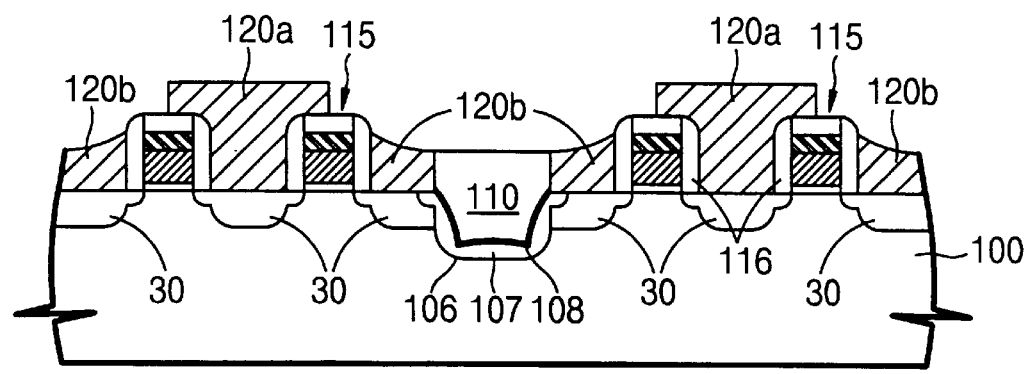

Referring to FIGS. 2E and 2F, in order to form contact pads 120a and 120b, a third conductive layer 120 (for example, a doped polysilicon layer) is formed on the structure and fills the spaces that are between adjacent gate electrode structures 115 and between trench isolation 110 and gate electrode structure 115. Typically, third conductive layer 120 is 1,000 to 3,000 Å thick. Then, a known etching process, using a contact pad forming mask 121, etches third conductive layer 120 to form contact pads 120a and 120b. Mask 121 can leave conductive layer 120 exposed over trench isolation 110 during etching if the etching is timed or otherwise controlled so that contact pads 120b remain after the etching. For a DRAM, each contact pad 120a electrically connects to a bit line, which is formed later. Contact pads 120b electrically connect to storage nodes which are also formed later.

Figure 2G:
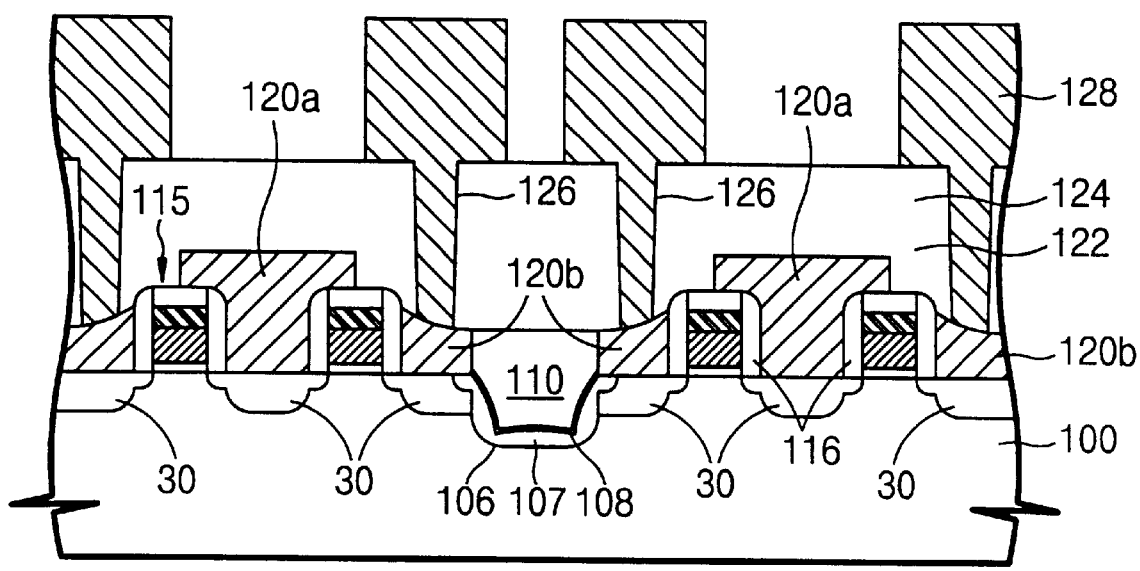

Referring to FIG. 2G, after the formation of contact pads 120a and 120b, a first interlayer insulating layer 122 is formed on the structure. First interlayer insulating layer 112 can be formed of $O_3$-TEOS, PSG, BPSG, PE-TEOS, BPTEOS or USG. Though not shown in FIG. 2G, bit lines are formed on first interlayer insulating layer 122 and electrically connected to contact pads 120a. More specifically, a known etching process etches first interlayer insulating layer 122 using a contact hole forming mask such that contact holes (not shown) exposes conductive pads 120a. Then, a conduct layer (not shown) and a silicon nitride layer (not shown) are sequentially formed on first interlayer insulating layer 122 so that the conductive layer fills the contact hole and contact pads 120a. The conductive layer for bit line can be metal or have a double layer structure including a doped polysilicon layer and a silicide layer. The silicon nitride layer and the conductive layer are etched to form the bit lines, and the silicon nitride layer is removed. Nitride spacers may be formed on the sidewalls of the bit lines.

After the formation of the bit lines, a second interlayer insulating layer 124 is formed on the structure including the bit lines and first interlayer insulating layer 122. Second interlayer insulating layer 124 can be made of $O_3$-TEOS, PSG, BPSG, PE-TEOS, BP-TEOS or USG layer. The combination of layers 122 and 124, which is illustrated in FIG. 2G, has a total thickness of about 1,000 to 5,000 Å.

A known etching process, using a contact hole forming mask, forms contact holes 126 through second and first interlayer insulating layers 124 and 122 to expose contact pads 120b, which are adjacent trench isolation 110. Then, a conductive layer is deposited in contact holes 126 and on second interlayer insulating layer 124 to a thickness that determines the height of the storage node 128. Finally, patterning of the conductive layer using known photolithography and etch processes forms storage nodes 128 which are electrically connected to contact pads 120b and source/drain regions 30.

The present invention forms contact pads without forming and patterning an insulating layer that fills spaces between gate electrode structures and between trench isolation and gate electrode structures. Instead, a conductive layer for the contact pads is formed and etched to form self-aligned contact pads between the gate electrode structures and between trench isolation and gate electrode structures. Accordingly, a short between a gate electrode and a contact pad caused by a misaligned etch can be prevented. The disclosed contact pads are particularly useful in DRAM that uses trench isolation to isolate memory cells and has storage nodes connected to the source/drain regions adjacent trench isolation. However, the contact pads are not limited to that use.

Although the invention has been described with reference to particular embodiments, the description is only an example of the inventor's application and should not be taken as a limitation. Various adaptations and combinations of is features of the embodiments disclosed are within the scope of the invention as defined by the following claims.

What is claimed is:

1. A semiconductor device comprising:
   an isolation region formed in a semiconductor substrate, wherein said isolation region protrudes from a top surface of said semiconductor substrate;
   a plurality of conductive structures formed on said top surface of said semiconductor substrate, wherein said conductive structures are spaced apart from one another and from said isolation region, said conductive structures having corresponding insulating sidewalls formed on respective sidewalls of said conductive structures;
   a first conductive pad formed in a space between two of said conductive structures, said first conductive pad contacting sidewalls of said two conductive structures; and
   a second conductive pad formed in a space between said isolation region and one of said conductive structures, said second conductive pad contacting a sidewall of said one of said conductive structures.

2. A method of forming contact pads in a semiconductor device, comprising:
   sequentially forming a first insulating layer and a first conductive layer on a semiconductor substrate;
   etching a selected portion of the first insulating layer and the first conductive layer and the semiconductor substrate to form a trench;
   forming a trench insulating layer to fill the trench;
   planarizing the trench insulating layer until a top surface of the first conductive layer is exposed, to form a trench isolation;
   sequentially forming a second conductive layer and a second insulating layer on the trench isolation and on the first conductive layer;
   patterning the second insulating layer, second conductive layer and first conductive layer to form a plurality of gate structures, wherein the trench isolation protrudes upward from a top surface of the semiconductor substrate;
   forming an insulating spacer on sidewalls of the conductive structure;
   forming a third conductive layer on the entire surface of the semiconductor substrate; and
   using a pad forming mask and etching the third conductive layer to form a first and second conductive pads.

3. The method according to claim 2, wherein the first conductive pad is a storage node contact pad that is formed between the trench isolation and the gate structure, and the second conductive pad is a bit line contact pad that is formed between the gate structures.

4. The method according to claim 2, wherein the first and third conductive layer are formed of doped polysilicon and to a thickness of about 1000 Å and 3000 Å respectively.

5. The method according to claim 2, wherein the second conductive layer is formed of doped polysilicon or tungsten silicide to a thickness of about 500 Å to 2000 Å.

6. The method according to claim 2, wherein the first insulating layer is about 50 Å to 150 Å thick gate oxide, the trench insulating layer is formed of $O_3$-TEOS to a thickness of about 2000 Å to 10000 Å, and the second insulating layer is formed of silicon nitride to a thickness of about 500 Å to 3000 Å.

7. The method according to claim 2, further comprising depositing a conductive pad insulating layer on said first and second conductive pads.

8. The method according to claim 7, wherein said conductive pad insulating layer comprises a first conductive pad insulating layer and a second conductive pad insulating layer, said depositing comprising:
   etching said conductive pad insulating layer to create an aperture exposing at least a portion of said first and second conductive pads.

9. The method according to claim 8, wherein the width of said aperture is less than the width of said second contact pads.

10. The method according to claim 7, wherein said conductive pad insulating layer comprises:
- a first conductive pad insulating layer containing a material selected from the group consisting of $O_3$-TEOS, PSG, BPSG, PE-TEOS, BP-TEOS, USG, and a combination thereof;
- a second conductive pad insulating layer containing a material selected from the group consisting of $O_3$-TEOS, PSG, BPSG, PE-TEOS, BP-TEOS, USG, and a combination thereof.

11. The method according to claim 7, wherein the thickness of said conductive pad insulating layer is between about 1,000 Å and about 5,000 Å.

12. The method according to claim 2, wherein said first and second conductive layers are respectively made of a doped polysilicon.

13. The method according to claim 2, wherein said first insulating layer is made of an oxide.

* * * * *